(12) United States Patent
Hsu et al.

(10) Patent No.: US 10,601,405 B2
(45) Date of Patent: Mar. 24, 2020

(54) BUFFER CIRCUIT

(71) Applicant: REALTEK SEMICONDUCTOR CORPORATION, Hsinchu (TW)

(72) Inventors: Hsin-Cheng Hsu, Hsinchu County (TW); Tay-Her Tsaur, Hsinchu County (TW); Po-Ching Lin, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/373,726

(22) Filed: Apr. 3, 2019

(65) Prior Publication Data

US 2019/0319613 A1    Oct. 17, 2019

(30) Foreign Application Priority Data

Apr. 12, 2018   (TW) .............................. 107112509 A (51) Int. Cl.
*H03K 3/356*    (2006.01)
*H03K 17/10*    (2006.01)
*H03K 17/687*   (2006.01)
*H03K 19/003*   (2006.01)

(52) U.S. Cl.
CPC ..... *H03K 3/356113* (2013.01); *H03K 17/102* (2013.01); *H03K 17/687* (2013.01); *H03K 19/003* (2013.01)

(58) Field of Classification Search
CPC .......... H03K 3/356113; H03K 17/102; H03K 17/687; H03K 19/003
USPC ........................................ 327/100, 108, 109
See application file for complete search history.

(56) References Cited

U.S. PATENT DOCUMENTS

| 2009/0108870 A1* | 4/2009 | Wang ............. | H03K 19/018521 326/68 |
| 2010/0141324 A1* | 6/2010 | Wang ............. | H03K 19/018521 327/333 |

* cited by examiner

*Primary Examiner* — William Hernandez
(74) *Attorney, Agent, or Firm* — WPAT, PC (57) ABSTRACT

The present invention discloses a buffer circuit including: a pre-driver providing a first, a second, a third and a fourth driving signals according to the voltages of voltage nodes and control signals; a voltage-detection and bias circuit providing bias voltages for an output buffer and an input buffer according to the voltages of the voltage nodes and the third driving signal; the output buffer determining conduction states of the transistors of the output buffer according to the voltages of the voltage nodes, the first and the second driving signals, and the bias voltages, and thereby outputting an output signal to a signal pad; and the input buffer determining the conduction states of the transistors of the input buffer according to the voltage of the signal pad, the voltages of the voltage nodes, the fourth driving signals, and the several bias voltages, and thereby generating an input signal.

5 Claims, 11 Drawing Sheets

BUFFER CIRCUIT

BACKGROUND OF THE INVENTION

1. Field of the Invention

The present invention relates to a buffer circuit, especially to a buffer circuit capable of preventing the low-voltage devices of the buffer circuit from being damaged by an overvoltage and preventing an undesired leakage current.

2. Description of Related Art

As the complementary metal oxide semiconductor (CMOS) techniques develop rapidly, the dimension of a transistor has been continually scaled down to reduce the chip area, increase the operation speed, and save the power consumption.

As the size of a transistor continues to shrink, the gate oxide of the transistor becomes thinner and thinner, and the maximum allowable voltage across the transistor's terminals (i.e., any two of the gate, the drain and the source of the transistor) is correspondingly decreased. If the gate-to-source or gate-to-drain or drain-to-source voltage of the transistor is higher than the nominal voltage $V_{NOMINAL}$ of the transistor, the transistor will be damaged. However, many advanced CMOS processes only fabricate transistors of a low nominal voltage $V_{NOMINAL}$ and the problem that the operation voltage for the transistors is higher than the nominal voltage $V_{NOMINAL}$ of the transistors emerges.

Figure 1:
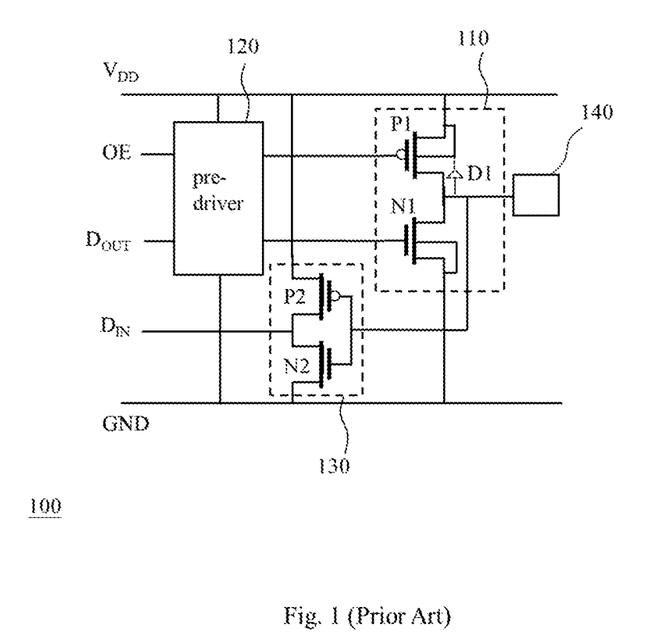
FIG. 1 shows an embodiment of a traditional input/output buffer.

FIG. 1 illustrates a traditional input/output buffer 100 which is coupled between a power supply node $V_{DD}$ and a ground node GND and includes an output buffer 110, a pre-driver 120 and an input buffer 130. The output buffer 110 includes a PMOS transistor P1 and an NMOS transistor N1. The input of the output buffer 110 is provided by the pre-driver 120 according to a control signal OE and an output signal $D_{OUT}$, and the output of output buffer 110 is provided for a node 140. The input buffer 130 includes a PMOS transistor P2 and an NMOS transistor N2. The input of input buffer 130 is originated from the node 140 and the output of input buffer 130 is treated as an input signal $D_{IN}$. In light of the above-mentioned configuration, if the voltage of the power supply node $V_{DD}$ or the voltage of the node 140 is higher than the nominal voltage $V_{NOMINAL}$ of the transistors in the buffer 100, the transistors in the output buffer 110 and the transistors in the input buffer 130 will suffer the problem that the voltage across a transistor's terminals is higher than the nominal voltage $V_{NOMINAL}$ of the same transistor and this problem will cause the consequence such as the gate-oxide breakdown and the hot-carrier degradation. Moreover, if the voltage of the node 140 is higher than the voltage of the power supply node $V_{DD}$, an undesirable leakage current will flow from the node 140 to the power supply node $V_{DD}$ through the parasitic diode D1 of the PMOS transistor P1.

SUMMARY OF THE INVENTION

An object of the present invention is to provide a buffer circuit capable of preventing the problems of the prior art.

An object of the present invention is to provide a buffer circuit including low-voltage devices and being capable of preventing an overvoltage from causing damage to the low-voltage devices.

The present invention discloses a buffer circuit capable of preventing the low-voltage devices of the buffer circuit from being damaged by an overvoltage and preventing an undesired leakage current. An embodiment of the buffer circuit includes a pre-driver, a voltage-detection and bias circuit, a high-voltage tolerance output buffer and a signal pad. The pre-driver is configured to provide a plurality of driving signals according to the voltages of a plurality of voltage nodes, a driver output signal and a plurality of control signals, in which the driving signals includes a first driving signal, a second driving signal and a third driving signal. The voltage-detection and bias circuit is configured to provide a plurality of bias voltages for the high-voltage tolerance output buffer according to the voltages of the voltage nodes, the voltage of the signal pad and the third driving signal. The high-voltage tolerance output buffer is configured to generate an output signal according to the voltages of the voltage nodes, the first driving signal, the second driving signal and the bias voltages. An exemplary implementation of the high-voltage tolerance output buffer includes: a plurality of PMOS transistors configured to determine conduction states of the PMOS transistors according to N bias voltage(s) among all the bias voltages and the first driving signal, in which the N is a positive integer not greater than the number of the total bias voltages; and a plurality of NMOS transistors configured to determine conduction states of the NMOS transistors according to M bias voltage(s) among all the bias voltages and the second driving signal, in which the M is a positive integer not greater than the number of the total bias voltages and the output signal is dependent on the conduction states of the PMOS transistors and the conduction states of the NMOS transistors. The signal pad is configured to output the output signal.

The present invention further discloses a buffer circuit capable of preventing an overvoltage from causing damage to the low-voltage devices of the buffer circuit. An embodiment of the buffer circuit includes a pre-driver, a voltage-detection and bias circuit, a high-voltage tolerance input buffer and a signal pad. The pre-driver is configured to provide a plurality of driving signals according to the voltages of a plurality of voltage nodes, a driver output signal and a plurality of control signals, in which the driving voltages include a fourth driving voltage. The voltage-detection and bias circuit is configured to provide a plurality of bias voltages according to the voltages of the voltage nodes, the voltage of the signal pad and the driving signals. The high-voltage tolerance input buffer is configured to generate an input signal according to the voltages of the voltage nodes, the fourth driving signal, the bias voltages and the voltage of the signal pad.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention discloses a buffer circuit capable of preventing the low-voltage devices of the buffer circuit from being damaged by an overvoltage and preventing an undesired leakage current.

Figure 2:
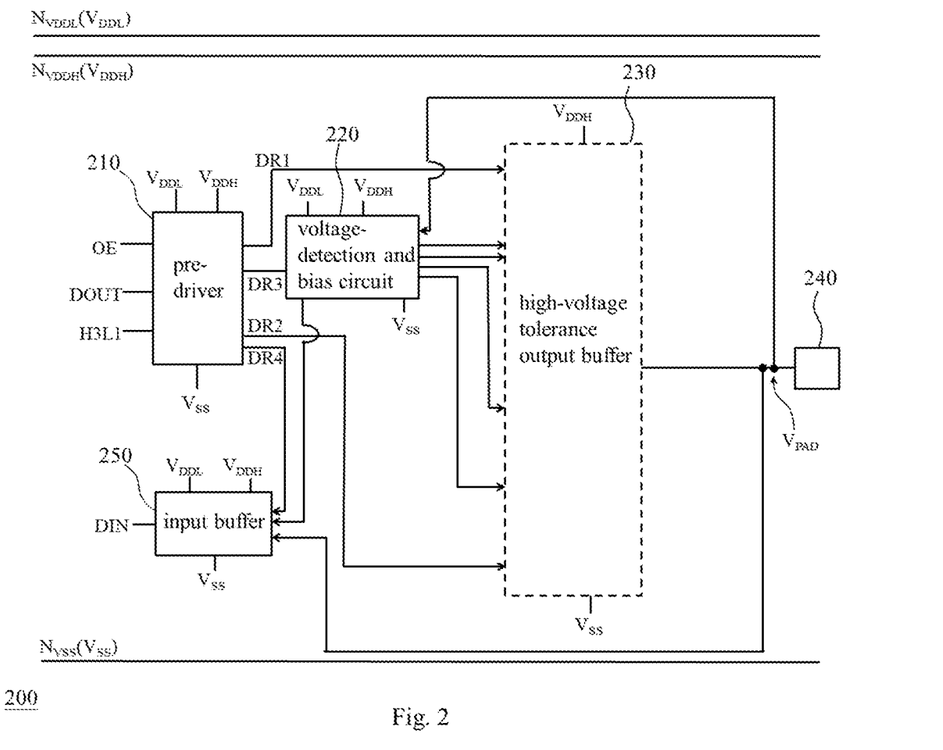
FIG. 2 shows an embodiment of the buffer circuit of the present invention.

FIG. 2 shows an embodiment of the buffer circuit of the present invention. The buffer circuit 200 of FIG. 2 is the combination of an input buffer circuit and an output buffer circuit and includes a pre-driver 210, a voltage-detection and bias circuit 220, a high-voltage tolerance output buffer 230, a signal pad 240 and a high-voltage tolerance input buffer 250 (input buffer for short), in which the pre-driver 210, the voltage-detection and bias circuit 220, the high-voltage tolerance output buffer 230 and the signal pad 240 can cooperate as the output buffer circuit, and the pre-driver 210, the voltage-detection and bias circuit 220, the signal pad 240 and the high-voltage tolerance input buffer 250 can cooperate as the input buffer circuit. In this embodiment, the buffer circuit 200 is coupled to a plurality of voltage nodes including a node $N_{VDDH}$, a node $N_{VDDL}$ and a node $N_{VSS}$ (e.g., ground node), in which the voltage $V_{DDH}$ of the node $N_{VDDH}$ is higher than the voltage $V_{DDL}$ of the node $N_{VDDL}$. Additionally, the buffer can operate in the following states:

(1) State 1: $V_{DDH}$ is approximately two times $V_{DDL}$, in which $V_{DDL}$ is equal to the nominal voltage $V_{NOMINAL}$ of a transistor (e.g., the nominal voltage is the maximum allowable voltage across the transistor's terminals in the buffer circuit 200). In an exemplary implementation, $V_{DDH}$=3.3V, $V_{DDL}$=1.8V, the voltage $V_{SS}$ of the node $N_{VSS}$ is 0V, and the voltage $V_{PAD}$ of the signal pad 240 is 0V or 3.3V. It should be noted that in this specification an exemplary implementation is for understanding, not for the limitation on the scope of the present invention.

(2) State 2: Both $V_{DDH}$ and $V_{DDL}$ are equal to the nominal voltage $V_{NOMINAL}$. In an exemplary implementation, $V_{DDH}$=1.8V, $V_{DDL}$=1.8V, $V_{SS}$=0V, and $V_{PAD}$=0V or 1.8V.

(3) State 3: $V_{PAD}$ is higher than $V_{DDH}$. In an exemplary implementation, $V_{DDH}$=0V, $V_{DDL}$=0V, $V_{SS}$=0V, and $V_{PAD}$=1.8V or 3.3V. The operation in State 3 is called power-saving operation; in State 3 $V_{DDH}$ is not supplied (e.g., $V_{DDH}$=0V) and consequently the leakage current from the signal pad 240 to the node $N_{VDDH}$ is not generated.

The operation of the buffer circuit 200 functioning as the aforementioned output buffer circuit is described in the following description. Please refer to FIG. 2. The pre-driver 210 is configured to provide a plurality of driving signals according to the voltages of the aforementioned voltage nodes ($V_{DDH}$, $V_{DDL}$, $V_{SS}$), a driver output signal DOUT and a plurality of control signals OE, H3L1 (which are described in detail in the later paragraph), in which the driving signals includes a first driving signal DR1, a second driving signal DR2 and a third driving signal DR3. Each of the driving signals can be a single signal or composed of subsidiary signals, and any two of the driving signals can be the same or different; in addition, the driving signals may optionally include one or more driving signals (e.g., a fourth driving signal DR4, a fifth driving signal DR5 and a sixth driving signal DR6) other than the driving signals DR1, DR2, DR3 for other circuits (e.g., the high-voltage tolerance input buffer 250, or the N-well bias circuit 310 of FIG. 3 and/or the P-well bias circuit 320 of FIG. 3), which implies that the number of the total driving signals is not limited to three. The voltage-detection and bias circuit 220 is configured to provide a plurality of bias voltages for the high-voltage tolerance output buffer 230 according to the voltages of the voltage nodes, the voltage $V_{PAD}$ of the signal pad 240 and the third driving signal DR3. The high-voltage tolerance output buffer 230 is configured to generate an output signal according to the voltages of the voltage nodes, the first driving signal DR1, the second driving signal DR2 and the bias voltages. The high-voltage tolerance output buffer 230 includes a plurality of PMOS transistors (e.g., the PMOS transistors in FIG. 4) and a plurality of NMOS transistors (e.g., the NMOS transistors in FIG. 4). The PMOS transistors are configured to determine the conduction states of the PMOS transistors according to the first driving signal DR1 and N bias voltage(s) among all the bias voltages; the NMOS transistors are configured to determine the conduction states of the NMOS transistors according to the second driving signal DR2 and M bias voltage(s) among all the bias voltages, in which each of the N and the M is a positive integer not greater than the number of the total bias voltages and the M bias voltages are not the N bias voltages. Furthermore, each of the bodies of the PMOS transistors and the bodies of the NMOS transistors can optionally receive the output of an N-well bias circuit (e.g., the N-well bias circuit 310 in FIG. 3) and the output of a P-well bias circuit (e.g., the P-well bias circuit in FIG. 3) so that the PMOS transistors and the NMOS transistors can operate more appropriately. The signal pad 240 is configured to output the output signal according to the conduction states of the PMOS transistors and the NMOS transistors. In addition, FIG. 3 shows another embodiment of the buffer circuit of the present invention; compared with FIG. 2, the buffer circuit 200 of FIG. 3 further includes an N-well bias circuit 310 and a P-well bias circuit 320 (which are described in detail in the later paragraph).

In light of the above, when the high-voltage tolerance output buffer 230 functions as an output stage in a normal operation, on condition that the voltage-detection and bias circuit 220 determines that $V_{DDH}$ or $V_{PAD}$ is higher than $V_{NOMINAL}$, the voltage-detection and bias circuit 220 outputs a suitable bias voltage to the high-voltage tolerance output buffer 230 by a voltage-reduction process so as to prevent the components in the high-voltage tolerance output buffer 230 from being damaged by an overvoltage; on condition that the voltage-detection and bias circuit 220 determines that $V_{PAD}$ is higher than $V_{DDH}$, the voltage-detection and bias circuit 220 outputs a suitable bias voltage to the high-voltage tolerance output buffer 230 so as to turn off a part of the circuits in the high-voltage tolerance output buffer 230 and thereby block a leakage current path from the signal pad 240 to the node $N_{VDDH}$ or the node $N_{VSS}$.

The following description describes the embodiments of the pre-driver 210, the voltage-detection and bias circuit 220 and the high-voltage tolerance output buffer 230 while the buffer circuit 200 functions as the aforementioned output buffer circuit.

Figure 3:
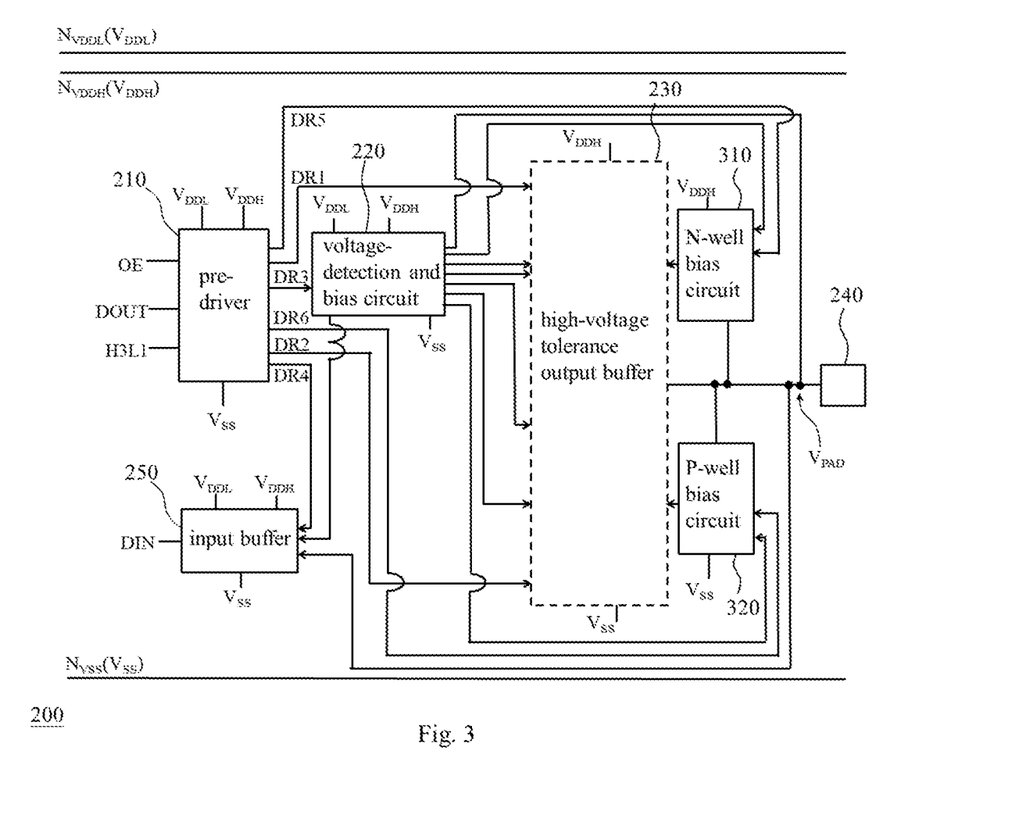
FIG. 3 shows another embodiment of the buffer circuit of the present invention.
Figure 9:
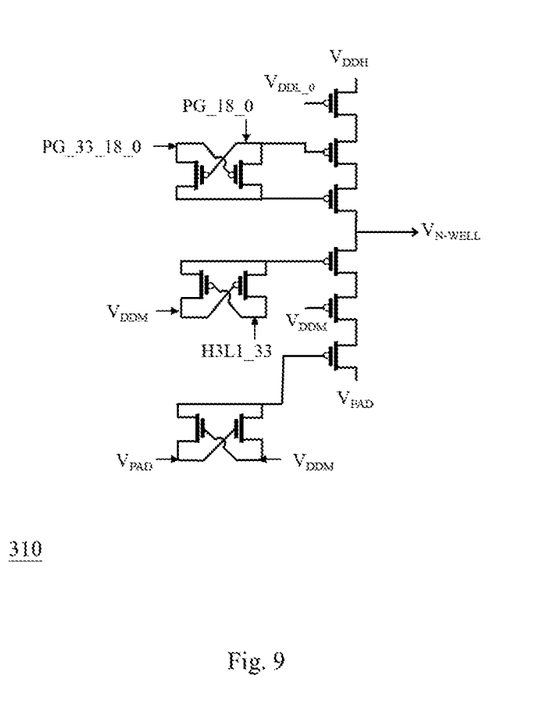
FIG. 9 shows an embodiment of the N-well bias circuit of FIG. 3.

Please refer to any of FIG. 2 and FIG. 3. An embodiment of the pre-driver 210 is a digital CMOS logical circuit. In the aforementioned State 1, providing the buffer circuit 200 is configured to output a voltage of a logical high level, each of the voltage levels of the control signal H3L1, the control signal OE and the driver output signal DOUT is the logical high level; in the meantime, the voltage of the subsidiary signal H3L1_18B (as shown in FIGS. 6, 7, 10 and 11) is $V_{SS}$, the voltage of the subsidiary signal H3L1_33 (as shown in FIGS. 7 and 9) is $V_{DDH}$, the voltage of the subsidiary signal OE_18 (as shown in FIG. 7) is $V_{DDL}$, the voltage of the first driving signal DR1 is $V_{DDL}$ and the voltage of the second driving signal DR2 is $V_{SS}$, in which every subsidiary signal is outputted by the pre-driver 210 and the relation between the subsidiary signals and the driving signals DR3, DR4, DR5, DR6 can be derived from the figures and the related description thereof. In the aforementioned State 1, providing the buffer circuit 200 is configured to output a voltage of a logical low level, each of the voltage levels of the control signal H3L1 and the control signal OE is the logical high level and the voltage level of the driver output signal DOUT is the logical low level; in the meantime, the voltage of the subsidiary signal H3L1_18B is $V_{SS}$, the voltage of the subsidiary signal H3L1_33 is $V_{DDH}$, the voltage of the subsidiary signal OE_18 is $V_{DDL}$, the voltage of the first driving signal DR1 is $V_{DDH}$ and the voltage of the second driving signal DR2 is $V_{DDL}$. In the aforementioned State 1, providing the buffer circuit 200 is configured to input a voltage of an arbitrary level, the voltage level of the control signal H3L1 is the logical high level, the voltage level of the control signal OE is the logical low level and the voltage level of the driver output signal DOUT is the arbitrary level; in the meantime, the voltage of the subsidiary signal H3L1_18B is $V_{SS}$, the voltage of the subsidiary signal H3L1_33 is $V_{DDH}$, the voltage of the subsidiary signal OE_18 is $V_{SS}$, the voltage of the first driving signal DR1 is $V_{DDH}$ and the voltage of the second driving signal DR2 is $V_{SS}$. In the aforementioned State 2, providing the buffer circuit 200 is configured to output a voltage of the logical high level, the voltage level of the control signal H3L1 is the logical low level, the voltage level of the control signal OE is the logical high level and the voltage level of the driver output signal DOUT is the logical high level; in the meantime, the voltage of the subsidiary signal H3L1_18B is $V_{DDL}$, the voltage of the subsidiary signal H3L1_33 is $V_{SS}$, the voltage of the subsidiary signal OE_18 is $V_{DDL}$, the voltage of the first driving signal DR1 is $V_{SS}$ and the voltage of the second driving signal DR2 is $V_{SS}$. In the aforementioned State 2, providing the buffer circuit 200 is configured to output a voltage of the logical low level, the voltage level of the control signal H3L1 is the logical low level, the voltage level of the control signal OE is the logical high level and the voltage level of the driver output signal DOUT is the logical low level; in the meantime, the voltage of the subsidiary signal H3L1_18B is $V_{DDL}$, the voltage of the subsidiary signal H3L1_33 is $V_{SS}$, the voltage of the subsidiary signal OE_18 is $V_{DDL}$, the voltage of the first driving signal DR1 is $V_{DDH}$ and the voltage of the second driving signal DR2 is $V_{DDL}$. In the aforementioned State 2, providing the buffer circuit 200 is configured to input a voltage of the arbitrary level, the voltage level of the control signal H3L1 is the logical low level, the voltage level of the control signal OE is the logical low level and the voltage level of the driver output signal DOUT is the arbitrary level; in the meantime, the voltage of the subsidiary signal H3L1_18B is $V_{DDL}$, the voltage of the subsidiary signal H3L1_33 is $V_{SS}$, the voltage of the subsidiary signal OE_18 is $V_{SS}$, the voltage of the first driving signal DR1 is $V_{DDH}$ and the voltage of the second driving signal DR2 is $V_{SS}$. In the aforementioned State 3, $V_{DDL}=V_{DDH}=0V$ and each of the voltages of the signals H3L1_18B, H3L1_33, OE_18, DR1 and DR2 is equivalent to 0V.

Figure 4:
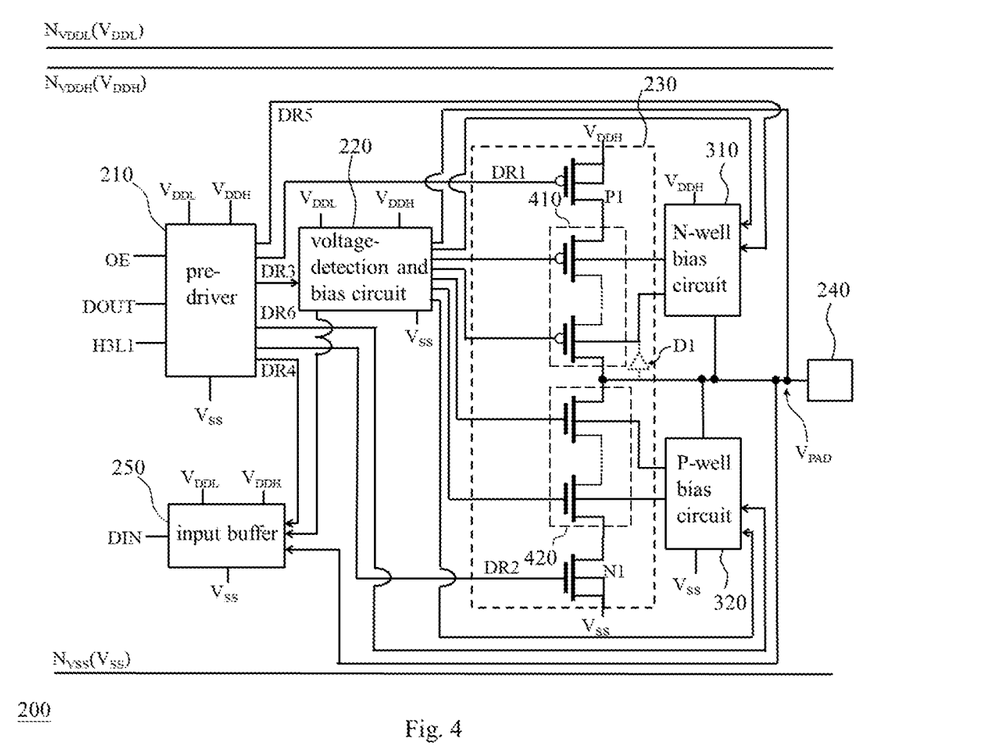
FIG. 4 shows an embodiment of the high-voltage tolerance output buffer of FIG. 3.
Figure 5:
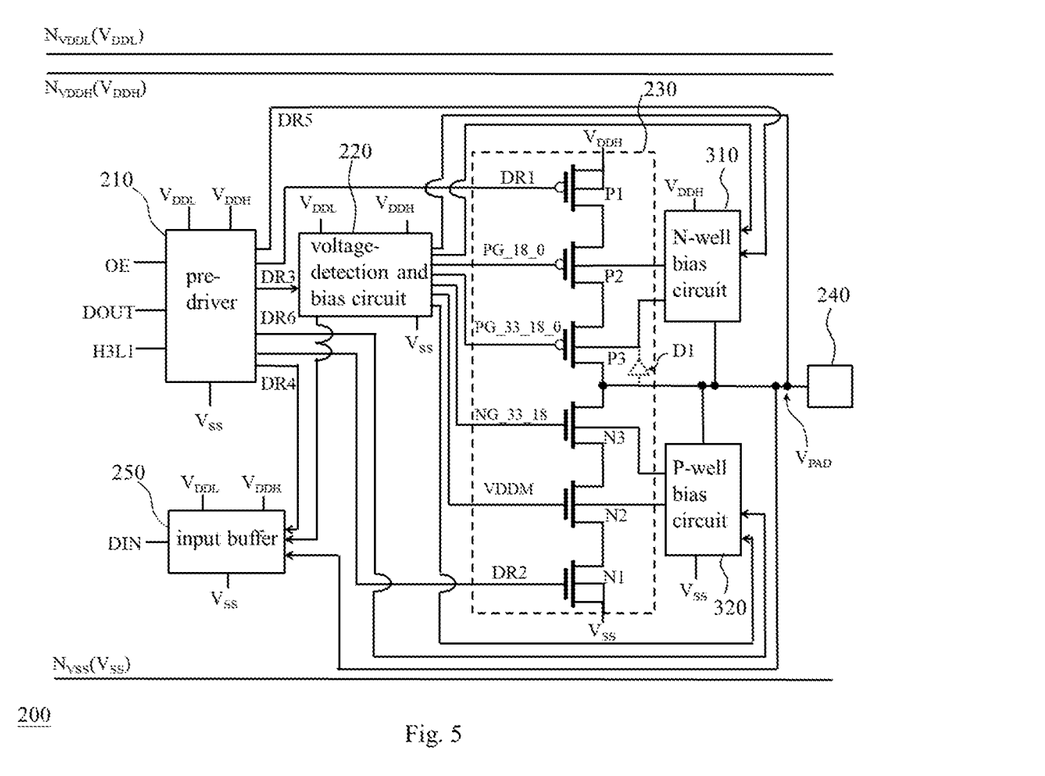
FIG. 5 shows an embodiment of the N PMOS transistors and the M NMOS transistors of FIG. 4.

FIG. 4 shows an embodiment of the high-voltage tolerance output buffer 230 of FIG. 3. FIG. 5 shows an embodiment of the N PMOS transistor(s) 410 and the M NMOS transistor(s) 420 of FIG. 4. The details of FIG. 4 and FIG. 5 are described in the later paragraph.

Please refer to any of FIG. 2 and FIG. 3. The voltage-detection and bias circuit 220 includes a plurality of subsidiary circuits that are configured to generate the bias voltage PG_18_0, the bias voltage PG_33_18_0, the bias voltage NG_33_18 and the bias voltage $V_{DDM}$. An embodiment of the subsidiary circuit for generating the bias voltage PG_18_0 is the circuit 600 of FIG. 6, in which the bias voltage $V_{DDM}$ and the voltage $V_{DDL\_0}$ can be applied to the other circuits of the present invention (e.g., the circuits in FIGS. 7-11). An embodiment of the subsidiary circuit for generating the bias voltage PG_33_18_0 is the circuit 700 of FIG. 7. An embodiment of the subsidiary circuit for generating the bias voltage NG_33_18 is the circuit 800 of FIG. 8.

Figure 6:
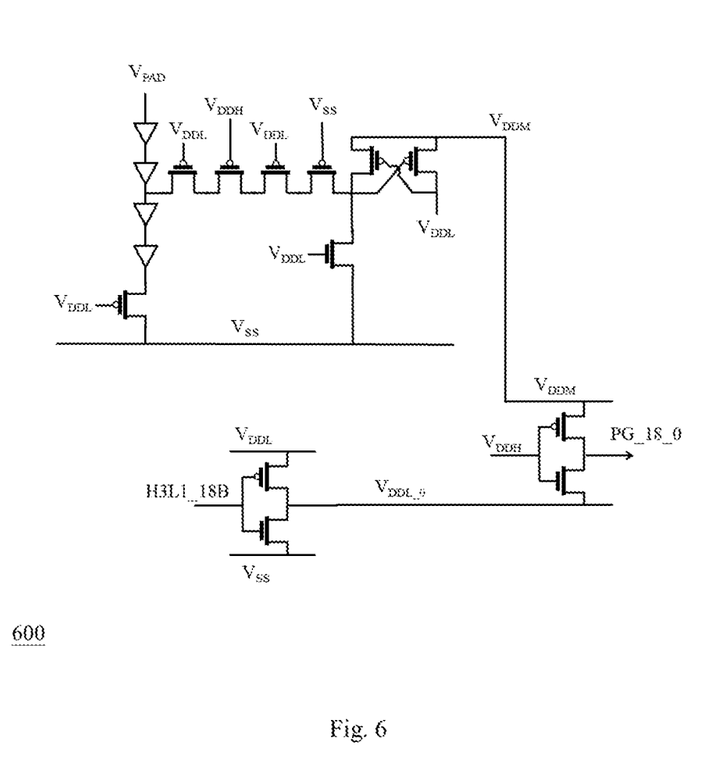
FIG. 6 shows an embodiment of a subsidiary circuit of the voltage-detection and bias circuit of FIG. 3 for generating the bias voltage PG_18_0.
Figure 7:
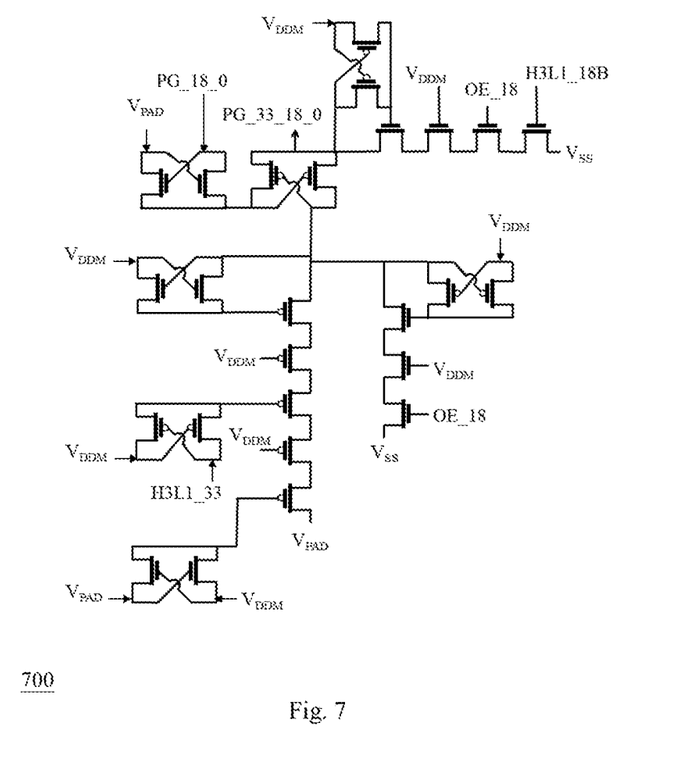
FIG. 7 shows an embodiment of a subsidiary circuit of the voltage-detection and bias circuit of FIG. 3 for generating the bias voltage PG_33_18_0.

Please refer to FIG. 6. In the aforementioned State 1 (e.g., $V_{DDH}=3.3V$ and $V_{DDL}=1.8V$) or State 2 (e.g., $V_{DDH}=1.8V$ and $V_{DDL}=1.8V$), the bias voltage $V_{DDM}$ is equal to $V_{DDL}$. In the aforementioned State 3 (e.g., $V_{DDH}=0V$ and $V_{DDL}=0V$), the bias voltage $V_{DDM}$ approximates $V_{PAD}/2$ due to the voltage division effect of the diodes connected in series as shown in FIG. 6.

Please refer to FIG. 6 again. In the aforementioned State 1, the voltage of the signal H3L1_18B is $V_{SS}$ so that $V_{DDL\_0}$ is equal to $V_{DDL}$. In the aforementioned State 2, the voltage of the signal H3L1_18B is $V_{DDL}$ so that $V_{DDL\_0}$ is equal to $V_{SS}$. In the aforementioned State 3, $V_{DDL}$ is equal to 0V so that $V_{DDL\_0}$ is equal to 0V. In addition, in State 1, the bias voltage PG_18_0 is equal to $V_{DDL\_0}$ the same as $V_{DDL}$. In State 2, the bias voltage PG_18_0 is equal to $V_{DDL\_0}$ the same as Vss. In State 3, the bias voltage PG_18_0 is equal to the bias voltage $V_{DDM}$ approximating $V_{PAD}/2$.

Please refer to FIG. 7. In the aforementioned State 1 while the buffer circuit 200 functions for output, the bias voltage PG_18_0 is $V_{DDL}$, the bias voltage $V_{DDM}$ is equal to $V_{DDL}$, the voltage of the signal H3L1_33 is $V_{DDH}$, the voltage of the signal OE_18 is $V_{DDL}$ and the voltage of the signal H3L1_18B is $V_{SS}$; consequently, the bias voltage PG_33_18_0 is equal to $V_{PAD}$ and not higher than $V_{DDL}$. In the aforementioned State 1 while the buffer circuit 200 functions for input, the bias voltage PG_18_0 is $V_{DDL}$, the bias voltage $V_{DDM}$ is equal to $V_{DDL}$, the voltage of the signal H3L1_33 is $V_{DDH}$, the voltage of the signal OE_18 is $V_{SS}$ and the voltage of the signal H3L1_18B is $V_{SS}$; consequently, the bias voltage PG_33_18_0 is equal to $V_{PAD}$ and not higher than $V_{DDL}$. In the aforementioned State 2 while the buffer circuit 200 functions for output, the bias voltage PG_18_0 is Vss, the bias voltage $V_{DDM}$ is equal to $V_{DDL}$, the voltage of the signal H3L1_33 is Vss, the voltage of the signal OE_18 is $V_{DDL}$ and the voltage of the signal H3L1_18B is $V_{DDL}$; consequently, the bias voltage PG_33_18_0 is equal to $V_{SS}$. In the aforementioned State 2 while the buffer circuit 200 functions for input, the bias voltage PG_18_0 is Vss, the bias voltage $V_{DDM}$ is equal to $V_{DDL}$, the voltage of the signal H3L1_33 is Vss, the voltage of the signal OE_18 is Vss and the voltage of the signal H3L1_18B is $V_{DDL}$; consequently, the bias voltage PG_33_18_0 is a floating voltage between 0V and 1.8V.

Figure 8:
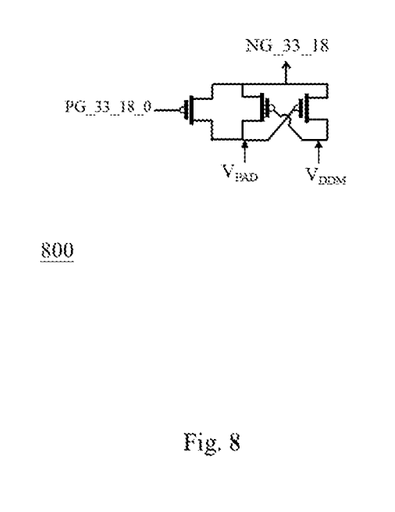
FIG. 8 shows an embodiment of a subsidiary circuit of the voltage-detection and bias circuit of FIG. 3 for generating the bias voltage NG_33_18.

Please refer to FIG. 8. In the aforementioned State 1, the bias voltage $V_{DDM}$ is equal to $V_{DDL}$, and the bias voltage PG_33_18_0 is equal to $V_{PAD}$ and not higher than $V_{DDL}$; consequently, the bias voltage NG_33_18 is equal to $V_{PAD}$ and not lower than $V_{DDL}$. In the aforementioned State 2, the bias voltage $V_{DDM}$ is equal to $V_{DDL}$, and the bias voltage PG_33_18_0 is equal to $V_{SS}$ or is a floating voltage between 0V and $V_{DDL}$; consequently, the bias voltage NG_33_18 is equal to $V_{DDL}$. In the aforementioned State 3, the bias voltage $V_{DDM}$ approximates $V_{PAD}/2$ and the bias voltage PG_33_18_0 is equal to $V_{PAD}$ so that the bias voltage NG_33_18 is equal to $V_{PAD}$.

FIG. 9 shows an embodiment of the N-well bias circuit 310 of FIG. 3. The N-well bias circuit 310 provides a suitable bias voltage $V_{N\text{-}WELL}$ for the N-wells of the PMOS transistors of the high-voltage tolerance output buffer 230 according to the voltages of the voltage nodes, the voltage of the signal pad 240, the control signals and the fifth driving signal DR5 and thereby prevents the PMOS transistors from being damaged by an overvoltage when $V_{DDH}$ or $V_{PAD}$ is higher than the nominal voltage $V_{NOMINAL}$ (e.g., $V_{DDL}$) and blocks the leakage current path from the signal pad 240 to the node $N_{VDDH}$ when $V_{DDH}$ is lower than $V_{PAD}$ (i.e., during the power-saving operation). In detail, please refer to FIG. 9. In the aforementioned State 1, the voltage $V_{DDL\_0}$ is equal to $V_{DDL}$, the bias voltage PG_18_0 is equal to $V_{DDL}$, the bias voltage PG_33_18_0 is equal to $V_{PAD}$ and not higher than $V_{DDL}$, the bias voltage $V_{DDM}$ is equal to $V_{DDL}$ and the voltage of the signal H3L1_33 is $V_{DDH}$ so that the bias voltage $V_{N\text{-}WELL}$ is equal to $V_{DDH}$. In the aforementioned State 2, the voltage $V_{DDL\_0}$ is equal to $V_{SS}$, the bias voltage PG_18_0 is equal to $V_{SS}$, the bias voltage PG_33_18_0 is equal to $V_{SS}$ or a floating voltage between 0V and $V_{DDL}$, the bias voltage $V_{DDM}$ is equal to $V_{DDL}$ and the voltage of the signal H3L1_33 is equal to $V_{SS}$ so that the bias voltage $V_{N\text{-}WELL}$ is equal to $V_{DDH}$. In the aforementioned State 3, the voltage $V_{DDL\_0}$ is equal to 0V, the bias voltage PG_18_0 approximates $V_{PAD}/2$, the bias voltage PG_33_18_0 is equal to $V_{PAD}$, the bias voltage $V_{DDM}$ approximates $V_{PAD}/2$ and the voltage of the signal H3L1_33 is 0V so that the bias voltage $V_{N\text{-}WELL}$ is equal to $V_{PAD}$. In addition, when $V_{DDH}$ or $V_{PAD}$ is higher than the nominal voltage $V_{NOMINAL}$, the bias voltage $V_{N\text{-}WELL}$ can be optionally outputted to the bodies of the PMOS transistors inside the high-voltage tolerance input buffer 250, the voltage-detection and bias circuit 220 and the N-well bias circuit 310 so as to prevent the PMOS transistors from being damaged by an overvoltage.

Figure 10:
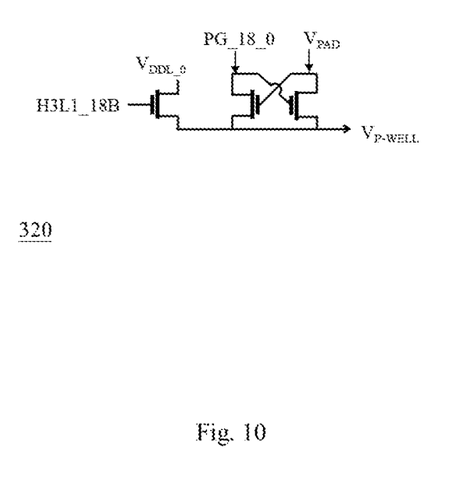
FIG. 10 shows an embodiment of the P-well bias circuit of FIG. 3.

FIG. 10 shows an embodiment of the P-well bias circuit 320. As shown in FIG. 10, the P-well bias circuit 320 provides a suitable bias voltage $V_{P\text{-}WELL}$ for the P-wells of the NMOS transistors of the high-voltage tolerance output buffer 230 according to the voltages of the voltage nodes, the voltage of the signal pad 240, the control signals and the sixth driving signal DR6 and thereby prevents the NMOS transistors from being damaged by an overvoltage when $V_{DDH}$ or $V_{PAD}$ is higher than the nominal voltage $V_{NOMINAL}$ (e.g., $V_{DDL}$). In detail, please refer to FIG. 10. In the aforementioned State 1, the voltage $V_{DDL\_0}$ is equal to $V_{DDL}$, the bias voltage PG_18_0 is equal to $V_{DDL}$ and the voltage of the signal H3L1_18B is Vss so that the bias voltage $V_{P\text{-}WELL}$ is equal to $V_{PAD}$ and not higher than $V_{DDL}$. In the aforementioned State 2, the voltage $V_{DDL\_0}$ is equal to $V_{SS}$, the bias voltage PG_18_0 is equal to $V_{SS}$ and the voltage of the signal H3L1_18B is $V_{DDL}$ so that the bias voltage $V_{P\text{-}WELL}$ is equal to Vss. In the aforementioned State 3, the voltage $V_{DDL\_0}$ is equal to 0V, the bias voltage PG_18_0 approximates $V_{PAD}/2$ and the voltage of the signal H3L1_18B is 0V so that the bias voltage $V_{P\text{-}WELL}$ approximates $V_{PAD}/2$. In addition, when $V_{DDH}$ or $V_{PAD}$ is higher than the nominal voltage $V_{NOMINAL}$, the bias voltage $V_{P\text{-}WELL}$ can be optionally outputted to the bodies of the NMOS transistors inside the high-voltage tolerance input buffer 250, the voltage-detection and bias circuit 220 and the P-well bias circuit 320 so as to prevent the NMOS transistors from being damaged by an overvoltage.

It should be noted that the buffer circuit 200 of FIG. 3 may optionally include the N-well bias circuit 310 without the P-well bias circuit 320 or include the P-well bias circuit 320 without the N-well bias circuit 310 in light the demand of implementation.

FIG. 4 shows an embodiment of the high-voltage tolerance output buffer 230 of FIG. 3. The high-voltage tolerance output buffer 230 includes a plurality of PMOS transistors and a plurality of NMOS transistors. The PMOS transistors include a PMOS transistor P1 and N PMOS transistor(s) 410. The NMOS transistors include a NMOS transistor N1 and M NMOS transistor(s) 420. Each of the N and the M is a positive integer.

FIG. 5 shows an embodiment of the N PMOS transistor(s) 410 and the M NMOS transistor(s) 420 of FIG. 4. In FIG. 5, the N PMOS transistors 410 are composed of two PMOS transistors P2, P3 while the M NMOS transistors are composed of two NMOS transistors N3, N2. In an alternative embodiment, at least one of the N and the M is an integer greater than one. In FIG. 5, the PMOS transistor P1 operates according to the first driving signal DR1 of the pre-driver 210. The PMOS transistor P2 operates according to the bias voltage PG_18_0 generated by the voltage-detection and bias circuit 220. The PMOS P3 operates according to the bias voltage PG_33_18_0 generated by the voltage-detection and bias circuit 220. The NMOS transistor N3 operates according to the bias voltage NG_33_18 generated by the voltage-detection and bias circuit 220. The NMOS transistor N2 operates according to the bias voltage $V_{DDM}$ generated by the voltage-detection and bias circuit 220. The NMOS transistor N1 operates according to the second driving signal DR2 of the pre-driver 210. The high-voltage tolerance output buffer 230 outputs an output signal to the signal pad 240 according to the voltages of the voltage nodes and the driving signals. In the aforementioned State 1 while the buffer circuit 200 functions to output a voltage of a logical high level, the voltage of the first driving signal DR1 is equal to $V_{DDL}$, the voltage of the second driving signal DR2 is equal to $V_{SS}$, the bias voltage PG_18_0 is equal to $V_{DDL}$, the bias voltage PG_33_18_0 is equal to $V_{PAD}$ and not higher than $V_{DDL}$, the bias voltage NG_33_18 is equal to $V_{PAD}$ and not lower than $V_{DDL}$, and the bias voltage $V_{DDM}$ is equal to $V_{DDL}$; consequently, the high-voltage tolerance output buffer 230 outputs $V_{DDH}$ to the signal pad 240 (i.e., $V_{PAD}=V_{DDH}$). In State 1 while the buffer circuit 200 functions to output a voltage of a logical low level, the voltage of the first driving signal DR1 is equal to $V_{DDH}$, the voltage of the second driving signal DR2 is equal to $V_{DDL}$, the bias voltage PG_18_0 is equal to $V_{DDL}$, the bias voltage PG_33_18_0 is equal to $V_{PAD}$ and not higher than $V_{DDL}$, the bias voltage NG_33_18 is equal to $V_{PAD}$ and not lower than $V_{DDL}$, and the bias voltage $V_{DDM}$ is equal to $V_{DDL}$; consequently, the high-voltage tolerance output buffer 230 outputs $V_{SS}$ to the signal pad 240 (i.e., $V_{PAD}=V_{SS}$). In State 1 while the buffer circuit 200 functions to input a voltage of an arbitrary level, the voltage of the first driving signal DR1 is equal to $V_{DDH}$, the voltage of the second driving signal DR2 is equal to $V_{SS}$, the bias voltage PG_18_0 is equal to $V_{DDL}$, the bias voltage PG_33_18_0 is equal to $V_{PAD}$ and not higher than $V_{DDL}$, the bias voltage NG_33_18 is equal to $V_{PAD}$ and not lower than $V_{DDL}$, and the bias voltage $V_{DDM}$ is equal to $V_{DDL}$; consequently, the high-voltage tolerance output buffer 230 is turned off to block the leakage current path from the signal pad 240 to the node $N_{VDDH}$ or the node $N_{VSS}$. In the aforementioned State 2 while the buffer circuit 200 functions to output a voltage of the logical high level, the voltage of DR1 is equal to $V_{SS}$, the voltage of DR2 is equal to $V_{SS}$, the bias voltage PG_18_0 is equal to $V_{SS}$, the bias voltage PG_33_18_0 is equal to $V_{SS}$, the bias voltage NG_33_18 is equal to $V_{DDL}$ and the bias voltage $V_{DDM}$ is equal to $V_{DDL}$; as a result, the high-voltage tolerance output buffer 230 outputs $V_{DDH}$ to the signal pad 240 (i.e., $V_{PAD}=V_{DDH}$). In State 2 while the buffer circuit 200 functions to output a voltage of the logical low level, the voltage of DR1 is equal to $V_{DDL}$, the voltage of DR2 is equal to $V_{DDL}$, the bias voltage PG_18_0 is equal to $V_{SS}$, the bias voltage PG_33_18_0 is equal to $V_{SS}$, the bias voltage NG_33_18 is equal to $V_{DDL}$ and the bias voltage $V_{DDM}$ is equal to $V_{DDL}$; as a result, the high-voltage tolerance output buffer 230 outputs $V_{SS}$ to the signal pad 240 (i.e., $V_{PAD}=V_{SS}$). In State 2 while the buffer circuit 200 functions to input a voltage of the arbitrary level, the voltage of DR1 is equal to $V_{DDH}$, the voltage of DR2 is equal to $V_{SS}$, the bias voltage PG_18_0 is equal to $V_{SS}$, the bias voltage PG_33_18_0 is equal to a floating voltage between 0V and $V_{DDL}$, the bias voltage NG_33_18 is equal to $V_{DDL}$ and the bias voltage $V_{DDM}$ is equal to $V_{DDL}$; as a result, the high-voltage tolerance output buffer 230 is turned off to block the leakage current path from the signal pad 240 to the node $N_{VDDH}$ or the node $N_{VSS}$. In the aforementioned State 3, the voltage of DR1 is equal to 0V, the voltage of DR2 is equal to 0V, the bias voltage PG_18_0 approximates $V_{PAD}/2$, the bias voltage PG_33_18_0 is equal to $V_{PAD}$, the bias voltage NG_33_18 is equal to $V_{PAD}$ and the bias voltage $V_{DDM}$ approximates $V_{PAD}/2$; as a result, the high-voltage tolerance output buffer 230 is turned off to block the leakage current path from the signal pad 240 to the node $N_{VDDH}$ or the node $N_{VSS}$. In addition, the body of the transistor P3 in FIG. 5 receives the bias voltage $V_{N\text{-}WELL}$ instead of $V_{DDH}$; therefore, in State 3, the high-voltage tolerance output buffer 230 does not generate a leakage current flowing from the signal pad 240 to the node $N_{VDDH}$ through the parasitic diode D1.

The following description describes how the buffer circuit 200 operates as the aforementioned input buffer circuit. Please refer to any of FIG. 2 and FIG. 3. The driving signals from the pre-driver 210 includes a fourth driving signal DR4. The high-voltage tolerance input buffer 250 generates an input signal DIN according to the voltages of the aforementioned voltage nodes, the fourth driving signal DR4 and the voltage $V_{PAD}$ of the signal pad 240. When the high-voltage tolerance input buffer 250 functions as an input stage in a normal operation, if the voltage-detection and bias circuit 220 determines that $V_{DDH}$ or $V_{PAD}$ is higher than $V_{NOMINAL}$, the voltage-detection and bias circuit 220 outputs a suitable bias voltage to the high-voltage tolerance input buffer 250 by a voltage-reduction process so as to prevent the components in the high-voltage tolerance input buffer 250 from being damaged by an overvoltage. If the voltage-detection and bias circuit 220 determines that $V_{PAD}$ is higher than $V_{DDH}$, the voltage-detection and bias circuit 200 outputs a suitable bias voltage to the high-voltage tolerance input buffer 250 to turn off a part of the circuits in the high-voltage tolerance input buffer 250 and thereby block the leakage current path from the signal pad 240 to any of the node $N_{VDDH}$ and the node $N_{VSS}$.

Figure 11:
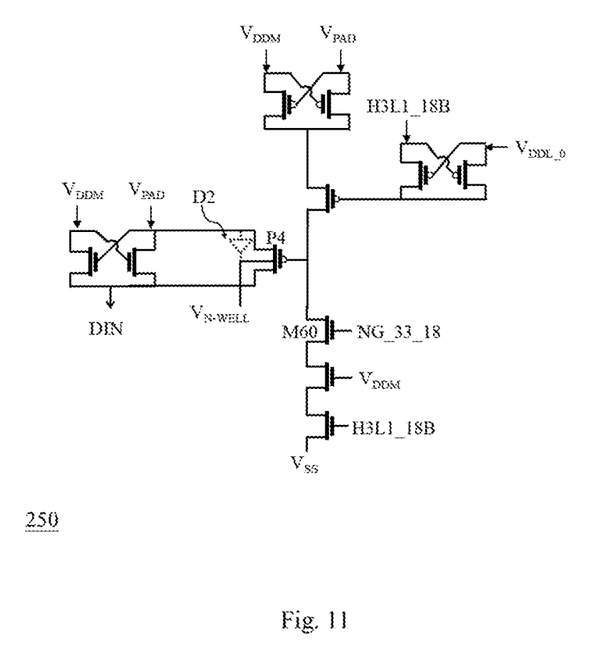
FIG. 11 shows an embodiment of the high-voltage tolerance input buffer of FIG. 3.

FIG. 11 shows an embodiment of the high-voltage tolerance input buffer 250. In the aforementioned State 1, the bias voltage $V_{DDM}$ is equal to $V_{DDL}$, the voltage $V_{DDL\_0}$ is equal to $V_{DDL}$, the bias voltage NG_33_18 is equal to $V_{PAD}$ and not lower than $V_{DDL}$ and the voltage of the signal H3L1_18B is $V_{SS}$; consequently, the voltage of the input signal DIN is equal to $V_{PAD}$ and not higher than $V_{DDL}$. In the aforementioned State 2, the bias voltage $V_{DDM}$ is equal to $V_{DDL}$, the voltage $V_{DDL\_0}$ is equal to $V_{SS}$, the bias voltage NG_33_18 is equal to $V_{DDL}$ and the voltage of the signal H3L1_18B is $V_{DDL}$; consequently, the voltage of the input signal DIN is equal to $V_{PAD}$. In the aforementioned State 3, the bias voltage $V_{DDM}$ approximates $V_{PAD}/2$, the voltage $V_{DDL\_0}$ is equal to 0V, the bias voltage NG_33_18 is equal to $V_{PAD}$ and the voltage of the signal H3L1_18B is 0V; consequently, the voltage of the input signal DIN approximates $V_{PAD}/2$. In addition, the body of the transistor P4 receives the bias voltage $V_{N\text{-}WELL}$ instead of $V_{DDH}$ and thus in State 3 the high-voltage tolerance input buffer 250 does not generate a leakage current flowing from the signal pad 240 to the node $N_{VDDH}$ through the parasitic diode D2.

Since those of ordinary skill in the art can appreciate the detail and the modification of the buffer circuit 200 as the input buffer circuit by referring to the other embodiments in this specification, repeated and redundant description is omitted here.

It should be noted that people of ordinary skill in the art can implement the present invention by selectively using some or all of the features of any embodiment in this specification or selectively using some or all of the features of multiple embodiments in this specification as long as such implementation is practicable, which implies that the present invention can be carried out flexibly. It should also be noted that the sentence "executing an operation according to a signal" or the like in this specification can be interpreted as "receiving the signal to execute the operation" or "receiving a derivative of the signal to execute the operation", in which the derivative of the signal could be an amplified/attenuated/delayed/reversed/equivalent signal of the signal. People who carry out the present invention can determine the type of the derivative in accordance with their demand and modify the implementation of the present invention correspondingly.

To sum up, the present invention can prevent an overvoltage from damaging low-voltage devices in a buffer circuit and prevent an undesired leakage current. The voltage drop between any two terminals of a transistor among the PMOS transistor(s) and the NMOS transistor(s) in the buffer circuit 200 is lower than the maximum withstand voltage (e.g., $(1+10\%)\times V_{DDL}$) of the same transistor.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:
1. A buffer circuit, comprising:
  a pre-driver configured to provide driving signals according to voltages of voltage nodes, a driver output signal and control signals;
  a voltage-detection and bias circuit configured to provide bias voltages for a high-voltage tolerance output buffer according to the voltages of the voltage nodes, a voltage of a signal pad and the driving signals;

the high-voltage tolerance output buffer configured to generate an output signal according to the voltages of the voltage nodes, the bias voltages and at least one of the driving signals, the high-voltage tolerance output buffer including:

PMOS transistors configured to determine conduction states of the PMOS transistors according to N bias voltage(s) of the bias voltages and at least one of the driving signals, in which the N is a positive integer; and NMOS transistors configured to determine conduction states of the NMOS transistors according to M bias voltage(s) of the bias voltages and at least one of the driving signals, in which the M is a positive integer and the output signal is dependent on the conduction states of the PMOS transistors and the conduction states of the NMOS transistors;

the signal pad configured to output the output signal; and a P-well bias circuit configured to provide NMOS body bias voltages for bodies of the NMOS transistors respectively.

2. The buffer circuit of claim 1, wherein the N is greater than one and the N bias voltages are generated by N different bias circuits respectively.

3. The buffer circuit of claim 1, wherein the M is greater than one and the M bias voltages are generated by M different bias circuits respectively.

4. The buffer circuit of claim 1, further comprising:

an N-well bias circuit configured to provide PMOS body bias voltages for bodies of the PMOS transistors respectively.

5. The buffer circuit of claim 1, further comprising:

a high-voltage tolerance input buffer configured to generate an input signal according to the voltages of the voltage nodes, the bias voltages, the voltage of the signal pad and at least one of the driving signals.

* * * * *